[United States Patent — Fujii et al., US 8,563,091 B2, Oct. 22, 2013]

(12) United States Patent
Fujii et al.

(10) Patent No.: US 8,563,091 B2
(45) Date of Patent: Oct. 22, 2013

(54) FILM FORMATION METHOD, FILM FORMATION DEVICE, PIEZOELECTRIC FILM, PIEZOELECTRIC DEVICE AND LIQUID DISCHARGE DEVICE

(75) Inventors: Takamichi Fujii, Kanagawa-ken (JP); Takayuki Naono, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 365 days.

(21) Appl. No.: 12/707,520

(22) Filed: Feb. 17, 2010

(65) Prior Publication Data
US 2010/0208005 A1    Aug. 19, 2010

(30) Foreign Application Priority Data
Feb. 18, 2009 (JP) .................. 2009-035080

(51) Int. Cl.
C23C 14/00 (2006.01)
H05H 1/00 (2006.01)

(52) U.S. Cl.
USPC ........................................ 427/523; 427/533

(58) Field of Classification Search
None
See application file for complete search history.

(56) References Cited

U.S. PATENT DOCUMENTS

| | | | |
|---|---|---|---|
| 5,006,706 A | 4/1991 | Marcus | |
| 5,043,049 A | 8/1991 | Takenaka | |
| 6,287,986 B1 | 9/2001 | Mihara | |
| 2005/0162047 A1 | 7/2005 | Torii et al. | |
| 2006/0113565 A1* | 6/2006 | Abe et al. | 257/197 |
| 2007/0007123 A1 | 1/2007 | Takahashi et al. | |
| 2008/0081128 A1 | 4/2008 | Fujii | |
| 2008/0081216 A1* | 4/2008 | Fujii et al. | 428/697 |

FOREIGN PATENT DOCUMENTS

| | | |
|---|---|---|
| EP | 0908924 A1 | 4/1999 |
| EP | 1560279 A2 | 8/2005 |
| JP | 11-343569 | 12/1999 |
| JP | 2008-81801 | 4/2008 |
| WO | WO 2005/093798 A1 | 10/2005 |

OTHER PUBLICATIONS

Hiramatsu et al., "Electrical and Optical Properties of Radio-Frequency-Sputtered Thin Films of $(ZnO)_5In_2O_3$," Chemistry of Materials, Oct. 1, 1998, vol. 10, No. 10, pp. 3033-3039.
Office Action for European Application No. 10152540.0, dated Mar. 11, 2013.
JP Office Action issued in corresponding JP Application No. 2009-035080 on Dec. 4, 2012.

* cited by examiner

*Primary Examiner* — Matthew Luu
*Assistant Examiner* — Erica Lin
(74) *Attorney, Agent, or Firm* — Birch, Stewart, Kolasch & Birch, LLP

(57) ABSTRACT

When a film containing constituent elements of a target is formed on a substrate through a vapor deposition process using plasma with placing the substrate and the target to face to each other, the film is formed with surrounding the substrate with a wall surface having the constituent elements of the target adhering thereto, and applying a physical treatment to the wall surface to cause the components adhering to the wall surface to be released into the film formation atmosphere.

17 Claims, 4 Drawing Sheets

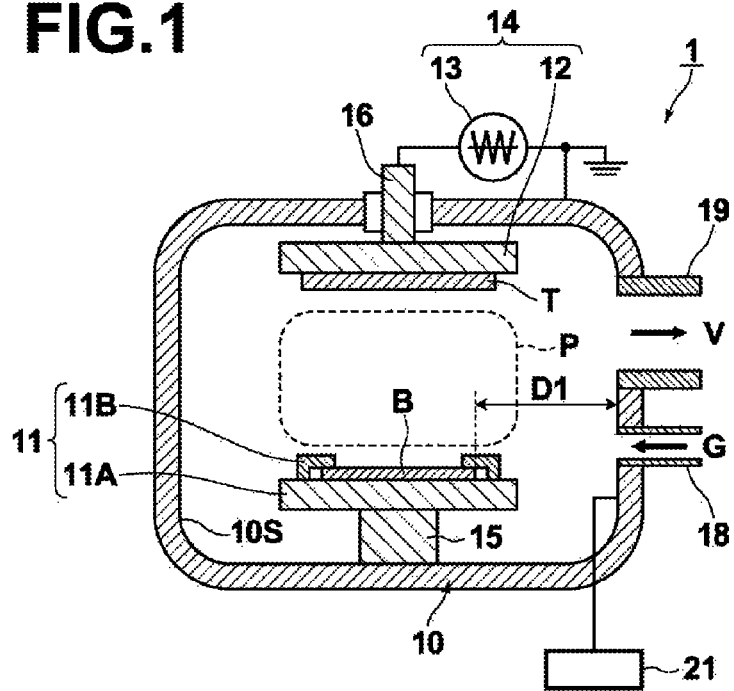
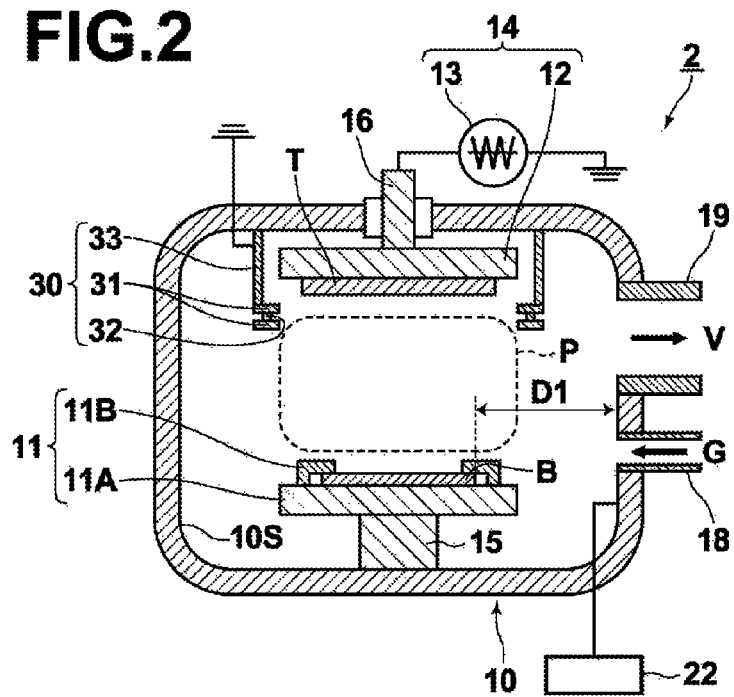

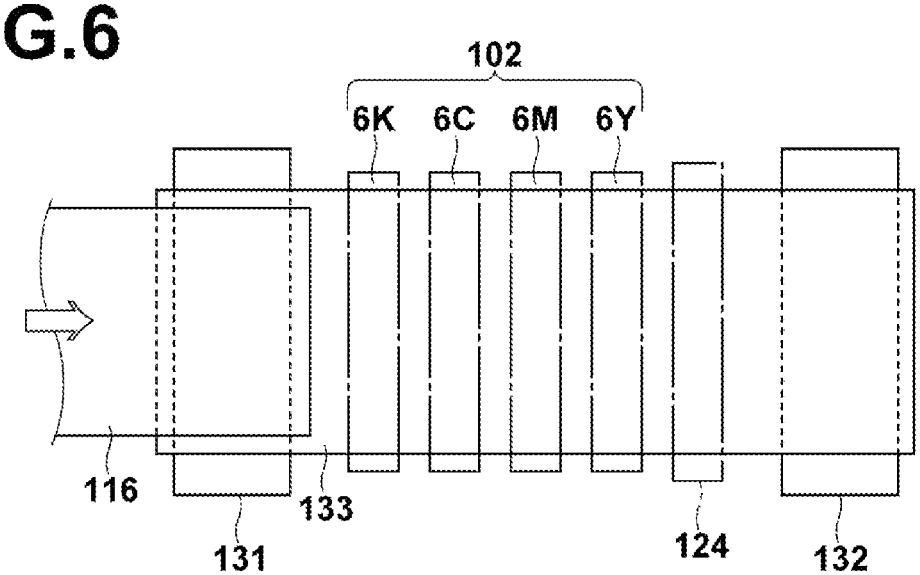

FILM FORMATION METHOD, FILM FORMATION DEVICE, PIEZOELECTRIC FILM, PIEZOELECTRIC DEVICE AND LIQUID DISCHARGE DEVICE

BACKGROUND OF THE INVENTION

1. Field of the Invention

The present invention relates to a film formation method and a film formation device for forming, on a substrate, a film containing constituent elements of a target through a vapor deposition process using plasma. The present invention also relates to a piezoelectric film formed with the film formation method, as well as a piezoelectric device and a liquid discharge device including the piezoelectric film.

2. Description of the Related Art

Sputtering is a film formation method, in which a substrate and a target are placed to face to each other, and a gas which is plasmized under reduced pressure is made to collide against the target, so that the energy of the collision makes molecules or atoms be ejected from the target and deposited on the substrate.

Theoretically, the composition of the film formed through sputtering should be substantially the same as the composition of the target. However, if the constituent elements of the film include an element with high vapor pressure, the element tends to be reverse sputtered out of the surface of the formed film, and this may often make it difficult to provide the film having substantially the same composition as the composition of the target.

The reverse sputtering is a phenomenon in which, if there is a large difference in ease of sputtering (sputter rate) among the constituent elements, a constituent element which is more susceptible to sputtering than the other constituent elements among the constituent elements deposited on the substrate is preferentially sputtered out of the surface of the film, although the constituent elements sputtered from the target have almost the same composition as the composition of the target.

For example, in PZT (lead zirconate titanate), which is a perovskite oxide with high ferroelectricity, or in a substitution system thereof, Pb is more susceptible to the reverse sputtering than Ti and Zr, and thus the Pb concentration in the film tends to be lower than the Pb concentration in the target. Also, in a perovskite oxide containing Bi or Ba at the A-site, these elements have high vapor pressure and thus have the similar tendency.

As another example, Zn element in Zn-containing compounds has high vapor pressure and thus has the similar tendency. For example, in a zinc oxide transparent conductor film or transparent semiconductor film, such as $InGaZnO_4$ (IGZO), which has excellent electric and optical characteristics comparable to indium tin oxide (ITO) and which is inexpensive and is an abundant resource, Zn is more susceptible to the reverse sputtering than the other constituent elements, and the composition of the film tends to contain less Zn than that in the composition of the target.

For the systems as presented in the above examples, in order to obtain a desired composition, such countermeasures have been taken as using a target having a composition in which content of the element susceptible to the reverse sputtering is higher than the desired composition. However, in order to stably provide a desired composition, it is preferred to be able to form a film having substantially the same composition as the composition of the target.

The above-described problem is not limited to the case of sputtering. Similar problem may occur in other film formation methods in which a substrate and a target are placed to face to each other and a film containing constituent elements of the target is formed on the substrate through a vapor deposition process using plasma.

In order to minimize the composition shift as described above, the present inventors have proposed in U.S. Patent Application Publication Nos. 20080081216 and 20080081128 to control a temperature during film formation Ts (° C.) and a potential difference Vs−Vf (V) between a plasma potential Vs (V) in plasma and a floating potential Vf (V).

SUMMARY OF THE INVENTION

In view of the above-described circumstances, the present invention is directed to providing a film formation method and a film formation device which are preferably applicable to a composition system, etc., susceptible to reverse sputtering to minimize a composition shift between a target and a formed film to stably provide a desired composition.

The invention is further directed to providing a piezoelectric film with a minimized composition shift between a target and a formed film to stably provide a desired composition.

An aspect of the film formation method of the invention is a film formation method for forming, on a substrate, a film containing constituent elements of a target through a vapor deposition process using plasma with placing the substrate and the target to face to each other, the method including: forming the film with surrounding the substrate with a wall surface having the constituent elements of the target adhering thereto, and applying a physical treatment to the wall surface to cause the components adhering to the wall surface to be released into a film formation atmosphere.

An aspect of the film formation device of the invention is a film formation device for forming, on a substrate, a film containing constituent elements of a target through a vapor deposition process using plasma, the device including: a vacuum vessel including therein a substrate holder and a target holder disposed to face to each other; plasma generating means for generating plasma within the vacuum vessel; and gas introducing means for introducing a gas to be plasmized into the vacuum vessel, wherein the substrate holder is surrounded with a wall surface having the constituent elements of the target adhering thereto, and the wall surface is connected to a physical treatment means, the physical treatment means applying a physical treatment to the wall surface to cause the components adhering to the wall surface to be released into a film formation atmosphere.

The piezoelectric film of the invention is formed with the above-described film formation method of the invention.

The piezoelectric device of the invention includes the above-described piezoelectric film of the invention, and an electrode for applying an electric field to the piezoelectric film.

The liquid discharge device of the invention includes the above-described piezoelectric device of the invention, and a liquid discharge member disposed adjacent to the piezoelectric device, the liquid discharge member including a liquid reservoir for storing a liquid, and a liquid discharge port for discharging the liquid from the liquid reservoir to the outside in response to application of the electric field to the piezoelectric film.

According to the invention, a film formation method and a film formation device can be provided, which are preferably applicable to a composition system, etc., susceptible to reverse sputtering to minimize a composition shift between the target and the formed film to stably provide a desired composition.

According to the invention, a piezoelectric film can be provided, in which a composition shift between the target and the formed film is minimized to stably provide a desired composition.

BRIEF DESCRIPTION OF THE DRAWINGS

FIG. 1 is a sectional view illustrating the entire structure of a film formation device according to a first embodiment of the invention, FIG. 2 is a sectional view illustrating the entire structure of a film formation device according to a second embodiment of the invention, FIG. 6 is a partial plan view of the inkjet recording device shown in FIG. 5.

DESCRIPTION OF THE PREFERRED EMBODIMENTS

Film Formation Method

Figure 3:
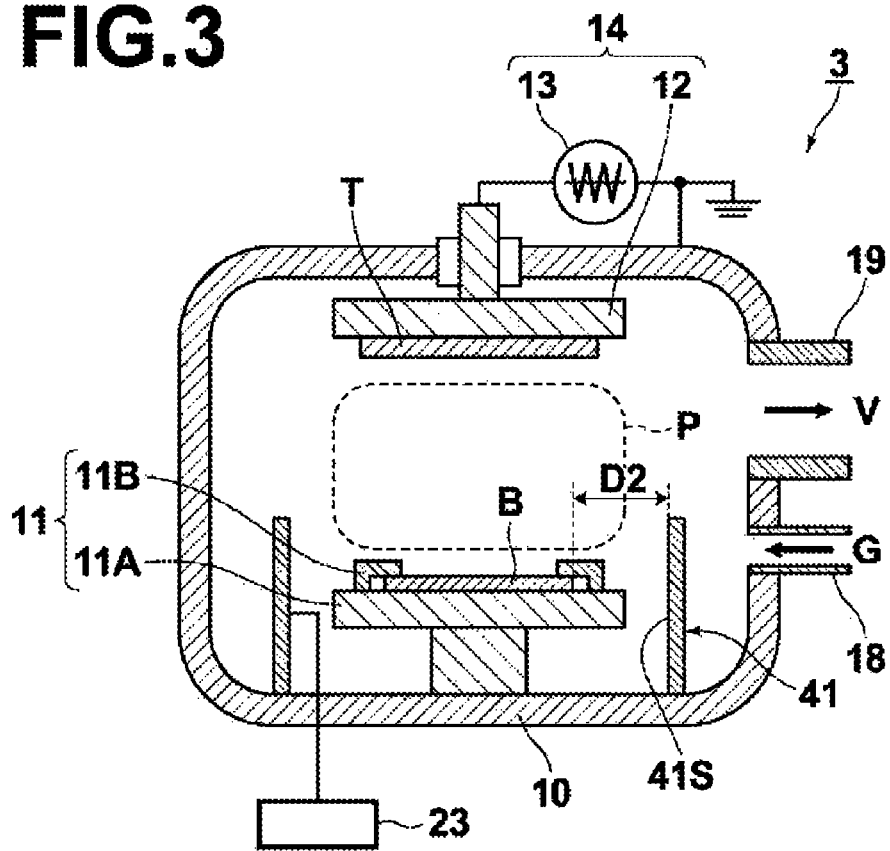
FIG. 3 is a sectional view illustrating the entire structure of a film formation device according to a third embodiment of the invention.

A film formation method according to the present invention is a film formation method for forming, on a substrate, a film containing constituent elements of a target through a vapor deposition process using plasma with placing the substrate and the target to face to each other. The method includes forming the film with surrounding the substrate with a wall surface having the constituent elements of the target adhering thereto, and applying a physical treatment to the wall surface to cause the components adhering to the wall surface to be released into the film formation atmosphere.

In the film formation method of the invention, the wall surface may be an inner wall surface of a vacuum vessel in which the film is formed or a surface of a wall member disposed between the substrate and the vacuum vessel.

According to the film formation method of the invention, the film is formed with surrounding the substrate with the wall surface having the constituent elements of the target adhering thereto and applying the physical treatment to the wall surface to cause the components adhering to the wall surface to be released into the film formation atmosphere. Thus, the components adhering to the wall surface can positively be fed to the substrate. Among the components adhering to the wall surface, an element susceptible to the reverse sputtering is easier to be released from the wall surface into a film formation atmosphere. Therefore, the element susceptible to reverse sputtering can positively be fed from the wall surface to the substrate. Thus, the film formation method of the invention is preferably applicable to a composition system, etc., susceptible to reverse sputtering to minimize a composition shift between the target and the formed film to stably provide a desired composition.

Whether or not the components are being fed from the wall surface to the substrate can be proved in the following manner, for example. A dummy substrate is attached on the wall surface, and a film formation speed is measured for each of the cases where the physical treatment is applied and where the physical treatment is not applied. If the film formation speed where the physical treatment is applied is lower than the film formation speed where the physical treatment is not applied, the fact that the components adhering to the wall surface is released into the film formation atmosphere is proved.

An example of the physical treatment applied to the wall surface in the film formation method of the invention is heat treatment. The heating temperature is not particularly limited; however, in view of effectively providing the effect of releasing the components adhering to the wall surface into the film formation atmosphere, the heating temperature may be at least 100° C., optionally at least 150° C., or further optionally at least 200° C. Although there is no problem in principle with a heating temperature of 500° C. or more, such a temperature complicates the device structure. Therefore, the heating temperature may be not more than 500° C.

Another examples of the physical treatment applied to the wall surface in the film formation method of the invention is a treatment to apply an AC voltage. In this case, the wall surface serves as a plasma electrode and a plasma condition is generated at the wall surface. This causes the components adhering to the wall surface to be released into the film formation atmosphere.

Yet another examples of the physical treatment applied to the wall surface in the film formation method of the invention is a treatment to apply a negative potential. In this case, plasma ions, which are usually positive ions, are pulled into the wall surface and the plasma ions sputter the wall surface. This causes the components adhering to the wall surface to be released into the film formation atmosphere. The potential to be applied to the wall surface is not particularly limited; however, in view of effectively providing the effect of releasing the components adhering to the wall surface into the film formation atmosphere, a potential difference between a potential at the wall surface and a plasma potential at a distance of 1 to 2 cm from the wall surface may be at least 20 V.

With the potential difference of at least 20 V, much of the elements can be sputtered out of the wall. However, the potential difference may optionally be at least 30 V, or further optionally be at least 50 V. Although there is no problem in principle with a potential difference of 100 V or more, such a potential difference may make sputtering of the wall material itself dominant, and may possibly cause mixing of impurities into the film. Therefore, the potential difference may be not more than 100 V.

The "potential" herein is measured through a single probe method or a triple probe method using a Langmuir probe. In principle, any other technique may be used as long as the potential can be measured.

The film formation method of the invention is applicable to film formation methods in which a substrate and a target are placed to face to each other, and a film containing constituent elements of the target is formed on the substrate through a vapor deposition process using plasma.

Examples of the vapor deposition process to which the invention is applicable include sputtering processes, such as dipolar sputtering, tripolar sputtering, DC sputtering, radio frequency sputtering (RF sputtering), ECR sputtering, magnetron sputtering, facing target sputtering, pulse sputtering, and ion beam sputtering. Other examples of the vapor deposition process, besides the sputtering processes, to which the invention is applicable, include ion plating and plasma CVD.

The film formation method of the invention is applicable to formation of films having any composition, such as conductor films, semiconductor films, insulator films and dielectric films. The film formation method of the invention is preferably applicable to a composition system, etc., which is susceptible to reverse sputtering, to successfully minimize a composition shift.

The invention is preferably applicable to a case where the formed film contains a plurality of elements other than a nonmetal and non-metalloid element (the "nonmetal and non-metalloid element" herein refers, for example, to oxygen element), and a sputter rate of an element having the highest sputter rate among the plurality of elements is at least 1.5 times a sputter rate of an element having the lowest sputter rate.

The susceptibility to sputtering is often represented by the sputter rate, such that the higher the sputter rate, the higher the susceptibility. The "sputter rate" is defined by a ratio between the number of incident ions and the number of sputtered atoms, and the unit is (atoms/ion).

With respect to the sputter film formation of PZT, which is a piezoelectric material, or a substitution system thereof, it has conventionally been known that, among the constituent elements Pb, Zr and Ti of PZT, Pb has the highest sputter rate, i.e., is most susceptible to sputtering. For example, Table 8.1.7 in "Shinku Handobukku (Handbook of Vacuum Technology)" (edited by ULVAK, Inc., published by Ohmsha, Ltd.) shows that the sputter rates under the condition of 300 eV Ar ions are: Pb=0.75, Zr=0.48 and Ti=0.65. This means that the susceptibility to sputtering of Pb is 1.5 times or more the susceptibility to sputtering of Zr.

The invention is preferably applicable to formation of a piezoelectric film.

The invention is preferably applicable to formation of a piezoelectric film containing, as a main component, one or two or more perovskite oxides represented by general formula (P) below:

$$ABO_3 \tag{P}$$

(wherein A represents an A-site element and includes at least one element selected from the group consisting of Pb, Ba, Sr, Bi, Li, Na, Ca, Cd, Mg, K, and lanthanide elements; B represents a B-site element and includes at least one element selected from the group consisting of Ti, Zr, V, Nb, Ta, Cr, Mo, W, Mn, Mg, Sc, Co, Cu, In, Sn, Ga, Zn, Cd, Fe, Ni, Hf and Al; and O represents oxygen. The molar ratio of the A-site element, the B site element and the oxygen element is 1:1:3 as a standard; however, the molar ratio may be varied from the standard molar ratio within a range where a perovskite structure is obtained).

The "main component" herein refers to a component whose content is at least 80 mol %.

Examples of the perovskite oxides represented by general formula (P) include: lead-containing compounds, such as lead titanate, lead zirconate titanate (PZT), lead zirconate, lead lanthanum titanate, lead lanthanum zirconate titanate, lead magnesium niobate zirconium titanate, lead nickel niobate zirconium titanate and lead zinc niobate zirconium titanate, as well as mixed crystal systems thereof; and non-lead-containing compounds, such as barium titanate, strontium barium titanate, bismuth sodium titanate, bismuth potassium titanate, sodium niobate, potassium niobate and lithium niobate, as well as mixed crystal systems thereof.

In view of improvement of electrical characteristics, the perovskite oxide represented by general formula (P) may contain one or two or more metal ions, such as Mg, Ca, Sr, Ba, Bi, Nb, Ta, W, and Ln (=lanthanide elements: La, Ce, Pr, Nd, Sm, Eu, Gd, Tb, Dy, Ho, Er, Tm, Yb, and Lu).

The invention is preferably applicable to formation of a film containing one or two or more perovskite oxides represented by general formula (P) and having the A-site element which is at least one metal element selected from the group consisting of Pb, Bi and Ba. Pb, Bi or Ba is an element having high vapor pressure and is susceptible to reverse sputtering.

Examples of the perovskite oxide represented by general formula (P) and containing Pb include lead titanate, lead zirconate titanate (PZT), lead zirconate, lead lanthanum titanate, lead lanthanum zirconate titanate, lead magnesium niobate zirconium titanate, and lead nickel niobate zirconium titanate.

Examples of the perovskite oxide represented by general formula (P) and containing Bi or Ba include barium titanate, barium strontium titanate, barium titanate zirconate, bismuth sodium titanate, bismuth potassium titanate, bismuth ferrite, bismuth ferrite lanthanum, and bismuth ferrite barium.

The invention is preferably applicable to formation of a film containing a Zn-containing compound. Zn is also an element having high vapor pressure and being susceptible to reverse sputtering.

The invention is preferably applicable to formation of a film containing a Zn-containing oxide represented by general formula (S) below:

$$In_xM_yZn_zO_{(x+3y/2+3z/2)} \tag{S}$$

(where M represents at least one element selected from the group consisting of In, Fe, Ga and Al. All of x, y and z are real numbers greater than 0).

Examples of the Zn-containing oxide represented by general formula (S) include $InGaZnO_4$ (IGZO) and $ZnIn_2\beta_4$, which are used as a transparent conductor film or a transparent semiconductor film in various applications.

As described above, the film formation method of the invention is preferably applicable to a composition system, etc., susceptible to reverse sputtering. According to the film formation method of the invention, a composition shift between the target and the formed film can be minimized to stably provide a desired composition. According to the film formation method of the invention, the components adhering to the wall surface can positively be fed to the substrate, thereby improving the film formation speed.

In U.S. Patent Application Publication Nos. 20080081216 and 20080081128 mentioned above at the "Description of the Related Art" section, high level control of the plasma potential is required. In contrast, the present invention can minimize the composition shift in a simple manner without requiring such high level control. It should be noted that other techniques for minimizing the composition shift, such as the techniques disclosed in U.S. Patent Application Publication Nos. 20080081216 and 20080081128, may be combined with the invention.

Film Formation Device of First Embodiment

A film formation device according to a first embodiment of the invention is described with reference to the drawings. FIG. 1 is a sectional view illustrating the entire structure of the device. In this embodiment, the description is given in conjunction with a radio frequency sputtering device (RF sputtering device), as an example.

A film formation device 1, as shown in FIG. 1, generally includes a vacuum vessel 10, which includes therein: a substrate holder 11, on which a substrate B can be loaded and the loaded substrate B can be heated to a predetermined temperature; and a target holder 12, on which a target T can be loaded. In the device of this embodiment, the interior of the vacuum vessel 10 serves as a film formation chamber. In the vacuum vessel 10, the substrate holder 11 and the target holder 12 are spaced from each other to face to each other. The vacuum vessel 10 is made of a conductor, such as stainless steel, and is grounded.

The substrate B is not particularly limited, and may be selected as appropriate according to the use from various substrates, such as Si substrates, oxide substrates, glass substrates, and various types of flexible substrates. The substrate B may be the above-described substrate provided with a film, such as an electrode, formed thereon. The composition of the target T is selected according to the composition of the film to be formed.

In the film formation device 1, the gas G introduced into the vacuum vessel 10 is plasmized through electric discharge from a plasma electrode (in this embodiment, the target holder 12 serves as the plasma electrode), and positive ions, such as Ar ions, generate. The generated positive ions sputter the target T. Constituent elements of the target T sputtered by the positive ions are released from the target and deposited on the substrate B in the neutral or ionized state. In the drawing, the plasma space is schematically indicated by the symbol "P".

The film formation device 1 includes a gas introducing means for introducing a gas G to be plasmized into the vacuum vessel 10. The gas introducing means includes a supply source (not shown) for supplying the gas G to be plasmized, and a gas inlet tube 18 for introducing the gas G supplied from the supply source into the vacuum vessel 10. The film formation device 1 further includes a gas outlet tube 19, which is connected to an exhaust means (not shown), such a vacuum pump, to discharge (indicated by "V" in the drawing) the gas from the vacuum vessel 10. The connection points of the gas inlet tube 18 and the gas outlet tube 19 to the vacuum vessel 10 may be designed as appropriate. However, it is preferable that the gas inlet tube 18 and the gas outlet tube 19 are provided such that the gas concentration in the vacuum vessel 10 is as homogeneous as possible. The gas G is not particularly limited, and may be Ar, Ar/$O_2$ mixed gas, etc.

The film formation pressure is not particularly limited; however, the film formation pressure may be 10 Pa or less. If the film formation pressure is higher than 10 Pa, ratio of the particles sputtered out from the target T and reaching the substrate B may be decreased due to scattering, etc., depending on the types of the elements. If the film formation pressure is 10 Pa or less, the condition of the plasma space is between an intermediate flow, which is intermediate between the molecule flow and the viscous flow, and the molecule flow, and therefore possibility of the particles sputtered out from the target T to be scattered before they reach the substrate B is negligibly low regardless of the types of the elements.

The substrate holder 11 generally includes: a plate-like holder body 11A, on which the substrate B is placed; and a securing member 11B, which is attached to the holder body 11A and secures edge portions of substrate B. The substrate holder 11 is held by a holding member 15, which is attached to the inner bottom surface of the vacuum vessel 10.

The target holder 12 is formed by a plate-like holder body, on which the target T is placed, and is held by a holding member 16 attached to the vacuum vessel 10. The holding member 16 and the vacuum vessel 10 are insulated from each other via an insulating material. The holding member 16 is connected to a radio frequency AC power supply (RF power supply) 13, which is provided externally to the vacuum vessel 10, and serves as a plasma electrode (cathode electrode) for the target holder 12 to generate plasma. An end of the RF power supply 13 opposite from the end thereof connected to the target holder is grounded.

In this embodiment, the RF power supply 13 and the target holder 12 serving as the plasma electrode (cathode electrode) form a plasma generating means 14 for generating plasma in the vacuum vessel 10.

In this embodiment, a physical treatment means 21 formed by a heating means, such as a heater, is attached to the vacuum vessel 10 so that at least an inner wall surface 10S of the vacuum vessel 10 can be heated to a predetermined temperature. The heating temperature is not particularly limited; however, the heating temperature may be at least 100° C., optionally at least 150° C., or further optionally at least 200° C. Although there is no problem in principle with a heating temperature of 500° C. or more, such a temperature complicates the device structure. Therefore, the heating temperature may be not more than 500° C.

The structure of the film formation device 1 of this embodiment is as described above. By using the film formation device 1 of this embodiment, the film formation method of the invention can be implemented. In the film formation device 1 of this embodiment, the substrate holder 11 is surrounded with the inner wall surface 10S of the vacuum vessel 10. In this embodiment, the inner wall surface 10S of the vacuum vessel 10 is heated to release the components adhering to the surface into the film formation atmosphere, and thus the above-described film formation method of the invention can be implemented.

A distance D1 between the outer circumference of the substrate B and the inner wall surface 10S of the vacuum vessel 10 is not particularly limited. In view of successfully feeing the components adhering to the inner wall surface 10S of the vacuum vessel 10 to the substrate B, D1 may be in the range from 20 to 150 mm, or optionally in the range from 50 to 150 mm.

Film Formation Device of Second Embodiment

A film formation device according to a second embodiment of the invention is described with reference to the drawings. FIG. 2 is a sectional view illustrating the entire structure of the device. The components which are the same as those in the first embodiment are denoted by the same reference numerals and explanation thereof is omitted.

In the film formation device 2 of this embodiment, a physical treatment means 22 formed by an AC voltage application means, such as a radio frequency AC power supply, is connected to the vacuum vessel 10 so that an AC voltage can be applied to at least the inner wall surface 10S of the vacuum vessel 10.

In this embodiment, since the voltage is applied to the vacuum vessel 10, a shield 30, which is grounded, is provided around the target holder 12.

The shield 30 includes: a plurality of metal rings 31, which are disposed on the side of the target T nearer to the substrate B to surround the outer circumference of the target T; spacers 32 disposed between the metal rings 31; and a holding member 33, which is attached on the inner surface of the vacuum vessel 10 to hold the metal rings 31. The metal rings 31, the spacers 32 and the holding member 33 are made of a conductive material, such as stainless steel. The number of the metal rings 31 is not particularly limited, and is two in the example shown in the drawing. The number of the metal rings 31 may be changed as necessary. The spacers 32 are disposed along the circumferential direction of the metal rings 31 with being spaced from each other to form clearances to facilitate flow of the gas G between the adjacent spacers 32. The holding member 33 and the vacuum vessel 10 are insulated from each other via an insulating material, and the holding member 33 is grounded (the insulating material is not shown).

By providing the grounded shield 30 around the target T, spread of the plasma can be minimized, and the plasma potential in the vicinity of the target T can be controlled. See U.S. Patent Application Publication No. 20080081128 of the present applicant for details of structure and function of the shield 30.

The structure of the film formation device 2 of this embodiment is as described above. By using the film formation device 2 of this embodiment, the film formation method of the invention can be implemented. In the film formation device 2 of this embodiment, the substrate holder 11 is surrounded with the inner wall surface 10S of the vacuum vessel 10. When an AC voltage is applied to the inner wall surface 10S of the vacuum vessel 10, the inner wall surface 10S of the vacuum vessel 10 serves as a plasma electrode and a plasma condition can be generated at the surface. This causes the components adhering to the surface to be released into the film formation atmosphere, and thus the above-described film formation method of the invention can be implemented.

The distance D1 between the outer circumference of the substrate B and the inner wall surface 10S of the vacuum vessel 10 is not particularly limited. In view of successfully feeding the components adhering to the inner wall surface 10S of the vacuum vessel 10 to the substrate B, D1 may be in the range from 20 to 150 mm, or optionally in the range from 50 to 150 mm.

Modifications to Second Embodiment

In the second embodiment described above, the physical treatment means 22 may be formed by a negative potential application means, such as a radio frequency AC power supply or DC power supply, to apply a negative potential to at least the inner wall surface 10S of the vacuum vessel 10. In this arrangement, the plasma ions, which are usually positive ions, are pulled into the inner wall surface 10S of the vacuum vessel 10 and the plasma ions sputter the inner wall surface 10S of the vacuum vessel 10. This causes the components adhering to the surface to be released into the film formation atmosphere, and thus the above-described film formation method of the invention can be implemented.

The potential to be applied to the inner wall surface 10S of the vacuum vessel 10 is not particularly limited; however, in view of effectively providing the effect of releasing the components adhering to the inner wall surface 10S of the vacuum vessel 10 into the film formation atmosphere, a potential difference between a potential at the inner wall surface 10S of the vacuum vessel 10 and a plasma potential at a distance of 1 to 2 cm from the inner wall surface 10S of the vacuum vessel 10 may be at least 20 V.

With the potential difference of at least 20 V, much of the elements can be sputtered out of the wall. However, the potential difference may optionally be at least 30 V, or further optionally be at least 50 V. Although there is no problem in principle with a potential difference of 100 V or more, such a potential difference may make sputtering of the wall material itself dominant, and may possibly cause mixing of impurities into the film. Therefore, the potential difference may be not more than 100 V.

Film Formation Device of Third Embodiment

A film formation device according to a third embodiment of the invention is described with reference to the drawings. FIG. 3 is a sectional view illustrating the entire structure of the device.

The components which are the same as those in the first embodiment are denoted by the same reference numerals and explanation thereof is omitted.

In the film formation device 3 of this embodiment, the vacuum vessel 10 is grounded, similarly to that in the first embodiment. In this embodiment, a wall member 41 is provided to stand from the inner bottom surface of the vacuum vessel 10 so as to surround the substrate holder 11. The wall member 41 is made of a conductive material, such as stainless steel, and is insulated from the vacuum vessel 10 via an insulating material (the insulating material is not shown).

A physical treatment means 23 formed by a heating means, such as a heater, is attached to the wall member 41 so that at least a surface 41S, which faces the substrate holder 11, of the wall member 41 can be heated to a predetermined temperature. The heating temperature is not particularly limited; however, the heating temperature may be at least 100° C., optionally at least 150° C., or further optionally at least 200° C. Although there is no problem in principle with a heating temperature of 500° C. or more, such a temperature complicates the device structure. Therefore, the heating temperature may be not more than 500° C.

The structure of the film formation device 3 of this embodiment is as described above. By using the film formation device 3 of this embodiment, the film formation method of the invention can be implemented. In the film formation device 3 of this embodiment, the substrate holder 11 is surrounded with the surface 41S of the wall member 41. In this embodiment, the surface 41S of the wall member 41 is heated to release the components adhering to the surface into the film formation atmosphere, and thus the above-described film formation method of the invention can be implemented.

A distance D2 between the outer circumference of the substrate B and the surface 41S of the wall member 41 facing the substrate holder 11 is not particularly limited. In view of successfully feeing the components adhering to the surface 41S of the wall member 41 to the substrate B, D2 may be in the range from 20 to 150 mm, or optionally in the range from 50 to 150 mm. The height of the wall member 41 is not particularly limited. If the height of the wall member 41 is significantly lower than the substrate surface, the components adhering to the surface 41S of the wall member 41 cannot successfully be fed to the substrate B. In contrast, if the height of the wall member 41 is significantly higher than the substrate surface, the presence of the wall member 41 may hinder feeding of the components from the target T to the substrate B. Therefore, the height of the wall member 41 may be within the range of ±50 mm of the height of the substrate surface.

Modifications to Third Embodiment

In the third embodiment described above, the physical treatment means 23 may be formed by an AC voltage application means, such as a radio frequency AC power supply, to apply an AC voltage to at least the surface 41S of the wall member 41. In this arrangement, the surface 41S of the wall member 41 serves as a plasma electrode and a plasma condition can be generated at the surface. This causes the components adhering to the surface to be released into the film formation atmosphere, and thus the above-described film formation method of the invention can be implemented.

In the third embodiment described above, the physical treatment means 23 may be formed by a negative potential application means, such as a radio frequency AC power supply or DC power supply, to apply a negative potential to at least the surface 41S of the wall member 41. In this arrangement, plasma ions, which are usually positive ions, are pulled into the surface 41S of the wall member 41 and the plasma ions sputter the surface 41S of the wall member 41. This causes the components adhering to the surface to be released into the film formation atmosphere, and thus the above-described film formation method of the invention can be implemented.

The film formation devices 1 to 3 of the first to third embodiments and the modifications thereto are preferably applicable to a composition system, etc., susceptible to reverse sputtering. According to the film formation devices 1 to 3 of the first to third embodiments and the modifications thereto, a composition shift between the target and the formed film can be minimized to stably provide a desired composition. According to the film formation devices 1 to 3 of the first to third embodiments and the modifications thereto, the components adhering to the wall surface can positively be fed to the substrate, thereby improving the film formation speed.

Piezoelectric Device and Inkjet Recording Head

Figure 4:
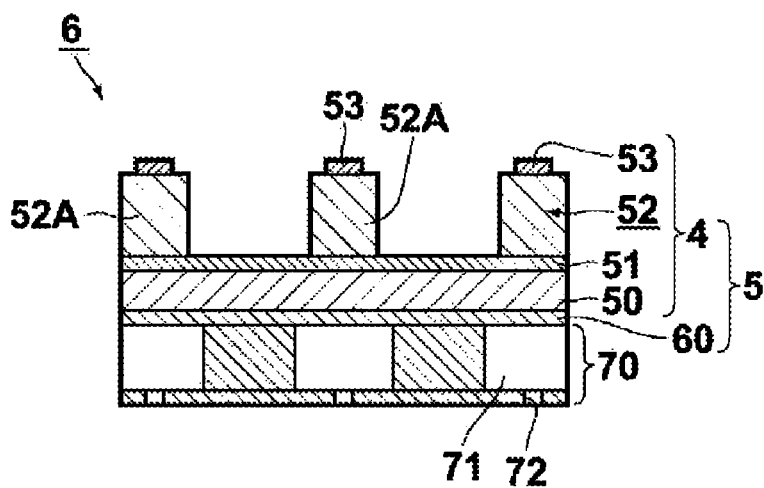
FIG. 4 is a sectional view illustrating the structures of a piezoelectric device and an inkjet recording head (liquid discharge device) according to one embodiment of the invention.

The structures of a piezoelectric device and an inkjet recording head (liquid discharge device) including the piezoelectric device according to one embodiment of the invention are described with reference to FIG. 4. FIG. 4 is a sectional view illustrating the main portion of the inkjet recording head (a sectional view taken along the thickness direction of the piezoelectric device). For ease of visual understanding, the components shown in the drawing are not to scale.

A piezoelectric device 4 of this embodiment includes a substrate 50, and a lower electrode 51, a piezoelectric film 52 and upper electrodes 53 which are sequentially formed on the substrate 50. An electric field in the thickness direction is applied to the piezoelectric film 52 via the lower electrode 51 and the upper electrode 53.

The lower electrode 51 is formed over substantially the entire surface of the substrate 50. The piezoelectric film 52, which is formed by line-shaped protrusions 52A arranged in stripes pattern extending in a direction perpendicular to the plane of the drawing, is formed on the lower electrode 51, and the upper electrodes 53 are formed on the individual protrusions 52A.

The pattern of the piezoelectric film 52 is not limited to one shown in the drawing, and may be designed as appropriate. Alternatively, the piezoelectric film 52 may be a continuous film. However, when the piezoelectric film 52 is not a continuous film and has the pattern including the plurality of separate protrusions 52A, the individual protrusions 52A can smoothly expand or contract, thereby preferably providing a larger displacement.

The substrate 50 is not particularly limited, and may be any of various substrates, such as silicon, silicon oxide, stainless steel (SUS), yttrium stabilized zirconia (YSZ), alumina, sapphire, SiC, and $SrTiO_3$. The substrate 50 may be a multilayer substrate, such as a SOI substrate including a $SiO_2$ film and a Si active layer formed in this order on a silicon substrate.

The composition of the lower electrode 51 is not particularly limited, and examples thereof may include a metal or a metal oxide, such as Au, Pt, Ir, $IrO_2$, $RuO_2$, $LaNiO_3$, and $SrRuO_3$, as well as combinations thereof. The composition of the upper electrode 53 is not particularly limited, and examples thereof may include the example materials described for the lower electrode 51, electrode materials commonly used in semiconductor processes, such as Al, Ta, Cr and Cu, and combinations thereof. The thicknesses of the lower electrode 51 and the upper electrode 53 are not particularly limited; however, their thicknesses may be in the range from 50 to 500 nm.

The piezoelectric film 52 is formed with the film formation method according to the invention. The piezoelectric film 52 may contain, as a main component, one or two or more perovskite oxides represented by general formula (P) described above. Optionally, the piezoelectric film 52 may contain one or two or more perovskite oxides represented by general formula (P) and may have the A-site element which is at least one metal element selected from the group consisting of Pb, Bi and Ba. The film thickness of the piezoelectric film 52 is not particularly limited; however, it is usually 1 μm or more (for example, 1-5 μm).

A piezoelectric actuator 5 includes a vibrating plate 60, which vibrates along with expansion and contraction of the piezoelectric film 52, attached on the back side of the substrate 50 of the piezoelectric device 4. The piezoelectric actuator 5 also includes a controlling means (not shown), such as a drive circuit, for controlling drive of the piezoelectric device 4.

The inkjet recording head (liquid discharge device) 6 generally includes, at the back side of the piezoelectric actuator 5, an ink nozzle (liquid storing and discharging member) 70 including an ink chamber (liquid reservoir) 71 for storing ink and an ink discharge port (liquid discharge port) 72 through which the ink is discharged from the ink chamber 71 to the outside. In the inkjet recording head 6, the piezoelectric device 4 expands or contracts when the intensity of the electric field applied to the piezoelectric device 4 is increased or decreased, thereby controlling discharge of the ink from the ink chamber 71 and the amount of the discharged ink.

Instead of providing the vibrating plate 60 and the ink nozzle 70 which are members separate from the substrate 50, parts of the substrate 50 may be machined to form the vibrating plate 60 and the ink nozzle 70. For example, if the substrate 50 is a multilayer substrate, such as a SOI substrate, the substrate 50 may be etched at the back side thereof to form the ink chamber 61, and then the substrate may be machined to form the vibrating plate 60 and the ink nozzle 70.

The structures of the piezoelectric device 4 and the inkjet recording head 6 of this embodiment are as described above. According to this embodiment, the piezoelectric film 52, in which a composition shift between the target and the formed film is minimized to stably provide a desired composition, and the piezoelectric device 4 including the piezoelectric film 52 can be provided.

Inkjet Recording Device

Figure 5:
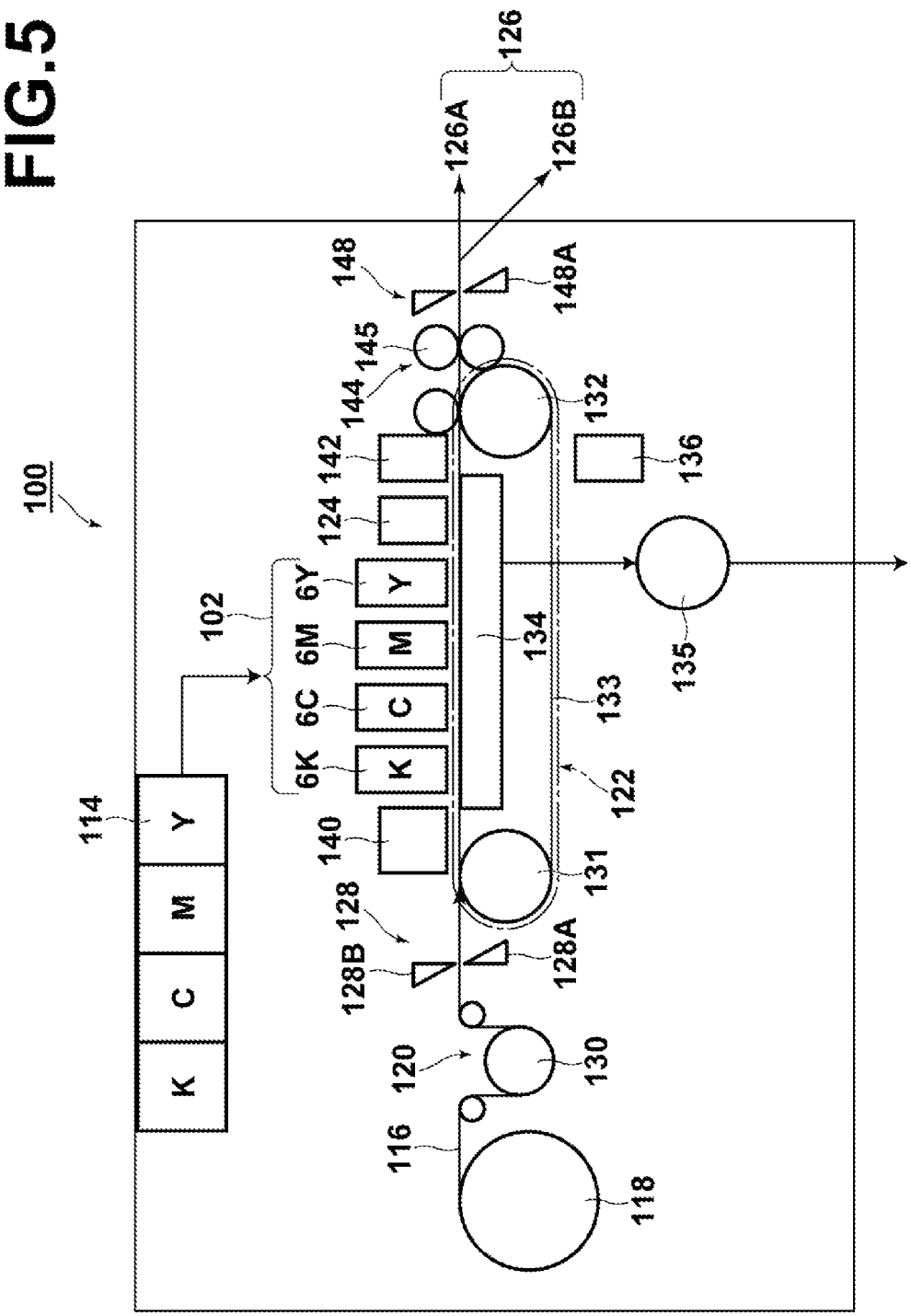
FIG. 5 is a diagram illustrating a configuration example of an inkjet recording device including the inkjet recording head shown in FIG. 4.

Now, an example configuration of an inkjet recording device including the inkjet recording head 6 of the above-described embodiment is described with reference to FIGS. 5 and 6. FIG. 5 shows the entire device configuration, and FIG. 6 is a partial plan view of the device.

An inkjet recording device 100 shown in the drawing generally includes: a printing section 102 having a plurality of inkjet recording heads (hereinafter simply referred to as "heads") 6K, 6C, 6M and 6Y provided correspondingly to ink colors; an ink storing and charging section 114 for storing inks to be fed to the heads 6K, 6C, 6M and 6Y; a paper feeding section 118 for feeding recording paper 116; a decurling section 120 for decurling the recording paper 116; a suction belt conveyer section 122 disposed to face to the nozzle surface (ink discharge surface) of the printing section 102, for conveying the recording paper 116 with keeping the flatness of the recording paper 116; a print detection section 124 for reading the result of printing at the printing section 102; and a paper discharge section 126 for discharging the printed recording paper (a print) to the outside.

Each of the heads 6K, 6C, 6M and 6Y forming the printing section 102 corresponds to the inkjet recording head 6 of the above-described embodiment.

At the decurling section 120, the recording paper 116 is decurled by a heating drum 130 heating the recording paper 116 in a direction opposite to the direction of the curl.

In the device using the roll paper, a cutter 128 is provided downstream the decurling section 120, as shown in FIG. 5, so that the roll paper is cut by the cutter into a sheet of a desired size. The cutter 128 is formed by a fixed blade 128A, which has a length equal to or larger than the width of the conveyance path for the recording paper 116, and a round blade 128B, which moves along the fixed blade 128A. The fixed blade 128A is disposed on the back surface side of the print, and the round blade 128B is disposed on the print surface side via the conveyance path. In a case where the device uses cut sheets, the cutter 128 is not necessary.

The decurled and cut recording paper sheet 116 is sent to the suction belt conveyer section 122. The suction belt conveyer section 122 includes an endless belt 133 wrapped around rollers 131 and 132, and is adapted such that at least an area of the belt facing the nozzle surface of the printing section 102 and a sensor surface of the print detection section 124 forms a horizontal (flat) surface.

The belt 133 has a width that is larger than the width of the recording paper sheet 116, and a number of suction holes (not shown) are formed in the belt surface. A suction chamber 134 is provided on the inner side of the belt 133 wrapped around the rollers 131 and 132 at a position where the suction chamber 134 faces to the nozzle surface of the printing section 102 and the sensor surface of the print detection section 124. A suction force generated by a fan 135 provides the suction chamber 134 with a negative pressure, thereby holding the recording paper sheet 116 on the belt 133 with suction.

As a motive force from a motor (not shown) is transmitted to at least one of the rollers 131 and 132, around which the belt 133 is wrapped, the belt 133 is driven in the clockwise direction in FIG. 5, and the recording paper sheet 116 held on the belt 133 is conveyed from the left to the right in FIG. 5.

In a case where margin-less printing, or the like, is carried out, the inks adhere on the belt 133. Therefore, a belt cleaning section 136 is provided at a predetermined position (any appropriate position other than the print region) on the outer side of the belt 133.

A heating fan 140 is provided upstream the printing section 102 along the paper sheet conveyance path formed by the suction belt conveyer section 122. The heating fan 140 blows heating air onto the recording paper sheet 116 to heat the recording paper sheet 116 before printing. Heating the recording paper sheet 116 immediately before printing promotes drying of the deposited ink.

The printing section 102 is a so-called full-line head, in which line heads, each having a length corresponding to the maximum paper width, are arranged in a direction (main scanning direction) perpendicular to the paper feed direction (see FIG. 6). Each recording head 6K, 6C, 6M, 6Y is formed by a line head, which has a plurality of ink discharge orifices (nozzles) provided across a length that is larger than at least one side of the recording paper sheet 116 of the maximum size printable by the inkjet recording device 100.

The heads 6K, 6C, 6M and 6Y respectively corresponding to the color inks of black (K), cyan (C), magenta (M) and yellow (Y) are disposed in this order from the upstream side along the feed direction of the recording paper sheet 116. By discharging the color inks from the heads 6K, 6C, 6M and 6Y while the recording paper sheet 116 is conveyed, a color image is recorded on the recording paper sheet 116.

The print detection section 124 is formed by a line sensor, or the like, which images the result of ink droplets deposited by the printing section 102, and the image of the deposited ink droplets read by the line sensor is used to detect discharge defects, such as clogging of the nozzles.

A drying section 142 formed, for example, by a heating fan for drying the printed image surface is disposed downstream the print detection section 124. Since contact with the printed surface should be avoided until the printed inks dry, blowing hot air may be preferred.

A heating and pressurizing section 144 for controlling the gloss of the image surface is disposed downstream the drying section 142. At the heating and pressurizing section 144, the image surface is pressed with a pressure roller 145 having a predetermined textured pattern on the surface thereof while the image surface is heated, thereby transferring the textured pattern onto the image surface.

The thus obtained print is discharged at the paper discharge section 126. Prints of intended images (prints on which intended images are printed) and test prints may separately be discharged. The inkjet recording device 100 includes a sorting means (not shown) for sorting the prints of intended images and the test prints and switching the discharge paths to selectively send the prints of intended images and the test prints to a discharge section 126A or 126B.

In a case where an intended image and a test print are printed at the same time on a larger paper sheet, a cutter 148 may be provided to cut off the test print area.

The configuration of the inkjet recording device 100 is as described above.

Modifications

The invention is not limited to the above-described embodiments, and may be modified as appropriate without departing from the spirit and scope of the invention.

EXAMPLES

Now, examples according to the invention and comparative examples are described.

Example 1

A 10-nm thick Ti film and a 150-nm thick Ir lower electrode were formed in this order on a 25-mm square silicon substrate through sputtering. Then, a 4-µm thick PZT piezoelectric film was formed on the resulting substrate through RF sputtering.

In this example, the film formation device 3 of the third embodiment, as shown in FIG. 3, was used, in which the vacuum vessel was grounded, the wall member was disposed around the substrate holder, and the heater was attached to the wall member. The film formation was carried out with heating the wall member so that the surface of the wall member facing the substrate holder is heated to 180° C. Other film formation conditions were as follows:

target: $Pb_{1.1}(Zr_{0.5}Ti_{0.5})O_3$ sintered body (4-inch diameter).
substrate temperature: 500° C.,
film formation gas: $Ar/O_2$=97.5/2.5 (ratio of flow rate),
film formation pressure: 0.5 Pa,
target-substrate distance: 80 mm, and
RF power: 200 W.

XRD analysis was carried out on the resulting PZT film, and the film was found to be a (100)-oriented film having a perovskite structure. XRF composition analysis was carried out on the resulting PZT film, and the ratio of Pb:Zr:Ti (molar ratio) was found to be 1.1:0.5:0.5, which was the same composition as the composition of the target.

A dummy substrate was attached on the surface of the wall member facing the substrate holder, and a film formation speed on the dummy substrate was measured to be 0.32 μm/h. The film formation speed on the dummy substrate in this example, where the heat treatment of the wall member was carried out, was smaller than that in later-described Comparative Example 1, where heat treatment of the wall member was not carried out. Thus, it was proved that the components adhering to the surface of the wall member facing the substrate holder were released into the film formation atmosphere.

Comparative Example 1

A PZT film was formed in the same manner as in Example 1, except that the wall member was cooled to control the temperature at the surface of the wall member facing the substrate holder to be about 30° C. (room temperature level).

XRD analysis was carried out on the resulting PZT film, and the film was found to have a pyrochlore structure, and a perovskite structure was not provided. XRF composition analysis was carried out on the resulting PZT film, and the ratio of Pb:Zr:Ti (molar ratio) was found to be 0.9:0.5:0.5, which was a composition containing less Pb than that in the composition of the target.

Similarly to Example 1, a dummy substrate was attached on the surface of the wall member facing the substrate holder, and a film formation speed on the dummy substrate was measured to be 0.40 μm/h.

Example 2

A 4 μm-thick $InGaZnO_4$ film was formed on a 25 mm-square silicon substrate through RF sputtering. In this example, the same film formation device as that used in Example 1 was used, except that a radio frequency AC power supply was attached to the wall member. The RF power applied to the wall member was 100 W. A potential at the surface of the wall member facing the substrate holder was −150 V. The potential difference between the potential at the surface of the wall member facing the substrate holder and the plasma potential at a distance of 1 to 2 cm from the surface of the wall member facing the substrate holder was about 30 V.

Other film formation conditions were as follows:
target: $InGaZnO_4$ sintered body (4-inch diameter),
substrate temperature: 200° C.,
film formation gas: $Ar/O_2$=90/10 (ratio of flow rate),
film formation pressure: 0.5 Pa,
target-substrate distance: 80 mm, and
RF power: 200 W.

XRF composition analysis was carried out on the resulting film, and the ratio of In:Ga:Zn (molar ratio) was found to be 1.0:0.95:0.95, which was about the same composition as the composition of the target.

A dummy substrate was attached on the surface of the wall member facing the substrate holder, and a film formation speed on the dummy substrate was measured to be 0.20 μm/h. The film formation speed on the dummy substrate in this example, where the treatment to apply an AC voltage to the wall member was carried out, was smaller than that in later-described Comparative Example 2, where the treatment to apply an AC voltage to the wall member was not carried out. Thus, it was proved that the components adhering to the surface of the wall member facing the substrate holder were released into the film formation atmosphere.

Comparative Example 2

An $InGaZnO_4$ film was formed in the same manner as in Example 2, except that the treatment to apply an AC voltage to the wall member was not carried out.

XRF composition analysis was carried out on the resulting film, and the ratio of In:Ga:Zn (molar ratio) was found to be 1.0:0.8:0.7, which was a composition containing less Ga and Zr than those in the composition of the target. Similarly to Example 2, a dummy substrate was attached on the surface of the wall member facing the substrate holder, and a film formation speed on the dummy substrate was measured to be 0.35 μm/h.

INDUSTRIAL APPLICABILITY

The present invention is applicable to formation of a film having any composition through a vapor deposition process using plasma. The invention is applicable, for example, to formation of a piezoelectric film that is used in piezoelectric actuators provided in inkjet recording heads, magnetic read/write heads, MEMS (Micro Electro-Mechanical Systems) devices, micropumps, ultrasound probes, ultrasound motors, etc., and ferroelectric devices, such as ferroelectric memory, or formation of conductor films or semiconductor films containing a Zn-containing compound.

What is claimed is:

1. A film formation method for forming a film on a substrate, the method comprising:
placing a substrate and a target comprising film constituent elements such that the substrate and the target face each other;
surrounding the substrate with a wall surface; and
subjecting the substrate and the target to a vapor deposition process using plasma to form the film, wherein the film is formed while physical treatment is applied to the wall surface to cause an element or elements that emerge from a part of the formed film and adhere to the wall surface during the vapor deposition process, to be released from the wall surface into a film formation atmosphere, wherein the wall surface comprises
an inner wall surface of a vacuum vessel in which the film is formed, or
a surface of a wall member which surrounds the side surface of the substrate and is disposed between the substrate and the vacuum vessel.

2. The film formation method as claimed in claim 1, wherein the physical treatment comprises a heat treatment.

3. The film formation method as claimed in claim 2, wherein the physical treatment comprises a heat treatment at a temperature of at least 100° C.

4. The film formation method as claimed in claim 1, wherein the physical treatment comprises a treatment to apply an AC voltage.

5. The film formation method as claimed in claim 1, wherein the physical treatment comprises a treatment to apply a negative potential.

6. The film formation method as claimed in claim 5, wherein a difference between a potential at the wall surface and a plasma potential at a distance of 1 to 2 cm from the wall surface is at least 20 V.

7. The film formation method as claimed in claim 1, wherein the vapor deposition process comprises sputtering.

8. The film formation method as claimed in claim 1, wherein the film comprises a plurality of elements other than a nonmetal and non-metalloid element, and a sputter rate of an element having a highest sputter rate among the plurality of elements is at least 1.5 times a sputter rate of an element having a lowest sputter rate.

9. The film formation method as claimed in claim 1, wherein the film comprises a piezoelectric film.

10. The film formation method as claimed in claim 9, wherein the film comprises, as a main component, one or two or more perovskite oxides represented by general formula (P):

$$ABO_3 \tag{P}$$

wherein A represents an A-site element and comprises at least one element selected from the group consisting of Pb, Ba, Sr, Bi, Li, Na, Ca, Cd, Mg, K, and lanthanide elements; B represents a B-site element and comprises at least one element selected from the group consisting of Ti, Zr, V, Nb, Ta, Cr, Mo, W, Mn, Mg, Sc, Co, Cu, In, Sn, Ga, Zn, Cd, Fe, Ni, Hf and Al; and O represents oxygen, and wherein a molar ratio of the A-site element, the B site element and the oxygen element is 1:1:3 as a standard; however, the molar ratio may be varied from the standard molar ratio within a range where a perovskite structure is obtained.

11. The film formation method as claimed in claim 10, wherein the film comprises one or two or more perovskite oxides represented by general formula (P), and the A-site element comprises at least one metal element selected from the group consisting of Pb, Bi and Ba.

12. The film formation method as claimed in claim 11, wherein the film comprises one or two or more perovskite oxides represented by general formula (P), and the A-site element comprises Pb.

13. The film formation method as claimed in claim 1, wherein the film comprises a Zn-containing compound.

14. The film formation method as claimed in claim 13, wherein the film comprises a Zn-containing oxide represented by general formula (S):

$$In_xM_yZn_zO_{(x+3y/2+3z/2)} \tag{S}$$

wherein M represents at least one element selected from the group consisting of In, Fe, Ga and Al, and all of x, y and z are real numbers greater than 0.

15. A piezoelectric film formed with the film formation method as claimed in claim 1.

16. A piezoelectric device comprising:
the piezoelectric film as claimed in claim 15; and
an electrode for applying an electric field to the piezoelectric film.

17. A liquid discharge device comprising:
the piezoelectric device as claimed in claim 16; and
a liquid discharge member disposed adjacent to the piezoelectric device, the liquid discharge member comprising a liquid reservoir for storing a liquid, and a liquid discharge port for discharging the liquid from the liquid reservoir to the outside in response to application of the electric field to the piezoelectric film.

* * * * *